US012637765B2

(12) United States Patent
Chandrasekaran et al.

(10) Patent No.: US 12,637,765 B2
(45) Date of Patent: May 26, 2026

(54) METHODS AND APPARATUS FOR A VALVE ASSEMBLY

(71) Applicant: ASM IP Holding B.V., Almere (NL)

(72) Inventors: Anirudhan Chandrasekaran, Scottsdale, AZ (US); Jereld Lee Winkler, Gilbert, AZ (US)

(73) Assignee: ASM IP Holding B.V., Almere (NL)

( * ) Notice: Subject to any disclaimer, the term of this patent is extended or adjusted under 35 U.S.C. 154(b) by 84 days.

(21) Appl. No.: 18/754,312

(22) Filed: Jun. 26, 2024

(65) Prior Publication Data

US 2025/0003073 A1    Jan. 2, 2025

Related U.S. Application Data

(60) Provisional application No. 63/523,972, filed on Jun. 29, 2023.

(51) Int. Cl.
*C23C 16/452* (2006.01)
*C23C 16/455* (2006.01)
*C23C 16/48* (2006.01)

(52) U.S. Cl.
CPC ...... *C23C 16/452* (2013.01); *C23C 16/45512* (2013.01); *C23C 16/45544* (2013.01); *C23C 16/45561* (2013.01); *C23C 16/48* (2013.01)

(58) Field of Classification Search
CPC ............ C23C 16/452; C23C 16/45561; C23C 16/45544; C23C 16/45512; C23C 16/48; C23C 16/482; C23C 16/483
See application file for complete search history.

(56) References Cited

U.S. PATENT DOCUMENTS

| | | | | |
|---|---|---|---|---|
| 4,503,333 A | | 3/1985 | Kulin | |
| 5,384,709 A | | 1/1995 | Seder | |
| 5,696,623 A | | 12/1997 | Fujie | |
| 5,728,224 A | * | 3/1998 | Laurent | ................. C23C 16/545 427/583 |
| 5,753,320 A | * | 5/1998 | Mikoshiba | .............. C23C 16/48 118/723 MR |
| 5,771,260 A | | 6/1998 | Elliott | |
| 5,812,403 A | * | 9/1998 | Fong | ................... C23C 16/4405 700/121 |
| 5,874,350 A | * | 2/1999 | Nakagawa | ............ C23C 16/452 438/758 |
| 5,968,587 A | * | 10/1999 | Frankel | ............. H01L 21/67103 219/390 |
| 6,007,780 A | | 12/1999 | Heredia | |
| 6,187,133 B1 | * | 2/2001 | Knoot | ................... C23C 16/482 392/416 |

(Continued)

FOREIGN PATENT DOCUMENTS

| | | |
|---|---|---|
| CA | 1295979 C | 2/1992 |
| DE | 3128967 C2 | 5/1984 |

(Continued)

*Primary Examiner* — David Colon-Morales

(74) *Attorney, Agent, or Firm* — Snell & Wilmer L.L.P.

(57) ABSTRACT

Various embodiments of the present technology may provide a valve assembly that activates chemistry using UV light. The valve assembly includes a primary valve manifold connected to secondary valve manifolds. A transparent connector may be disposed between the primary valve manifold and the secondary valve manifold. A UV light may be disposed adjacent to the transparent connector.

20 Claims, 4 Drawing Sheets

(56) References Cited

U.S. PATENT DOCUMENTS

Figure 1:
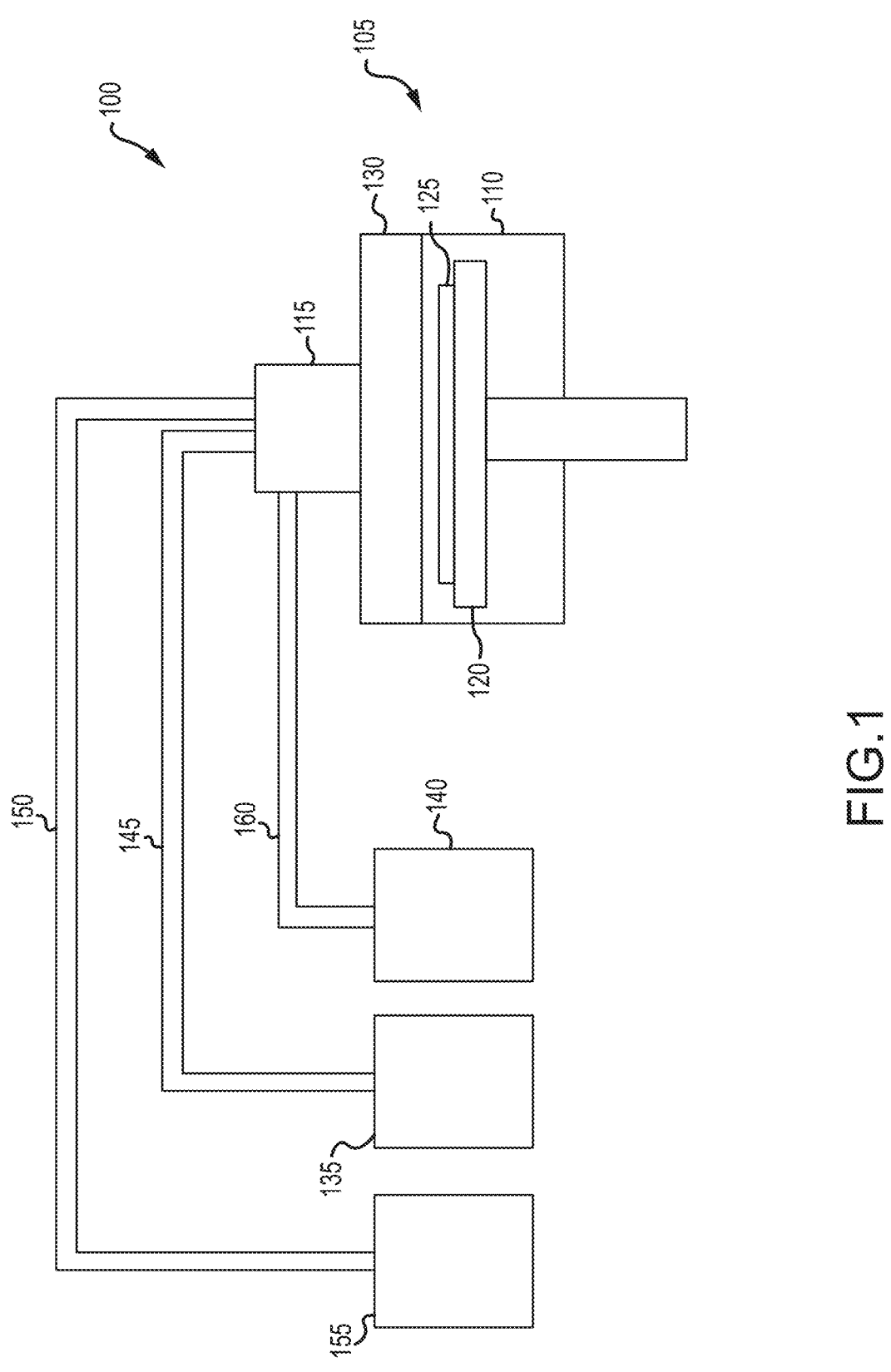

| | | | | |
|---|---|---|---|---|
| 6,362,494 | B1 * | 3/2002 | Yagi | C23C 16/45523 |
| | | | | 257/615 |
| 6,435,215 | B1 | 8/2002 | Redemann | |
| 6,443,147 | B1 | 9/2002 | Matter | |
| 6,470,888 | B1 | 10/2002 | Matter | |
| 6,506,253 | B2 * | 1/2003 | Sakuma | C23C 16/45519 |
| | | | | 118/620 |
| 6,787,782 | B1 | 9/2004 | Krosney | |
| 6,916,398 | B2 * | 7/2005 | Chen | C23C 16/4412 |
| | | | | 257/E21.171 |
| 6,930,041 | B2 * | 8/2005 | Agarwal | H01L 21/022 |
| | | | | 257/E21.243 |
| 7,175,713 | B2 * | 2/2007 | Thakur | H01L 21/6719 |
| | | | | 118/723 R |
| 7,204,885 | B2 * | 4/2007 | Derderian | C23C 16/4557 |
| | | | | 118/724 |
| 7,204,886 | B2 * | 4/2007 | Chen | C23C 16/45561 |
| | | | | 118/715 |
| 7,780,789 | B2 * | 8/2010 | Wu | C23C 16/45512 |
| | | | | 156/345.33 |
| 8,900,519 | B2 | 12/2014 | Krosney | |
| 8,950,433 | B2 | 2/2015 | Manofsky, Jr. | |
| 8,956,458 | B2 * | 2/2015 | Kozawa | C01B 33/027 |
| | | | | 118/724 |
| 9,139,453 | B2 | 9/2015 | Snowball | |
| 9,439,996 | B2 | 9/2016 | Gross | |
| 9,528,184 | B2 * | 12/2016 | Sieber | C23C 16/458 |
| 9,574,268 | B1 * | 2/2017 | Dunn | C23C 16/45512 |
| 9,797,528 | B2 | 10/2017 | Veneroni | |
| 10,130,726 | B2 | 11/2018 | Pujol | |
| 10,683,571 | B2 * | 6/2020 | Jdira | C23C 16/45525 |
| 10,787,741 | B2 * | 9/2020 | Tolle | H01J 37/32816 |
| 11,118,262 | B2 * | 9/2021 | Tsuji | C23C 16/50 |
| 11,230,383 | B2 | 1/2022 | Hiller | |
| 11,427,908 | B2 * | 8/2022 | Shanbhag | C23C 16/45561 |
| 11,578,408 | B2 * | 2/2023 | Kamio | H01L 21/67017 |
| 11,613,362 | B2 | 3/2023 | Hiller | |
| 12,024,774 | B2 * | 7/2024 | Kim | C23C 16/45561 |
| 12,264,393 | B2 * | 4/2025 | Wei | C23C 16/45544 |
| 12,325,914 | B2 * | 6/2025 | Salinas | C23C 16/345 |
| 12,368,024 | B2 * | 7/2025 | Zafar | H01J 37/3299 |
| 2002/0136018 | A1 | 9/2002 | Yoo | |
| 2003/0170151 | A1 | 9/2003 | Hunter | |
| 2004/0020366 | A1 | 2/2004 | Walker | |
| 2004/0050326 | A1 * | 3/2004 | Thilderkvist | H01L 21/67253 |
| | | | | 156/345.33 |
| 2005/0000913 | A1 | 1/2005 | Betterly | |
| 2005/0023488 | A1 | 2/2005 | Katsuki | |

| | | | | |
|---|---|---|---|---|
| 2005/0035301 | A1 | 2/2005 | Wang | |
| 2006/0207431 | A1 | 9/2006 | Baca | |
| 2007/0101867 | A1 | 5/2007 | Hunter | |
| 2007/0102280 | A1 | 5/2007 | Hunter | |
| 2007/0193604 | A1 | 8/2007 | Weber | |
| 2007/0248487 | A1 | 10/2007 | Kay | |
| 2007/0256635 | A1 * | 11/2007 | Bour | C23C 16/45565 |
| | | | | 118/715 |
| 2007/0281106 | A1 * | 12/2007 | Lubomirsky | C23C 16/509 |
| | | | | 427/569 |
| 2007/0289534 | A1 * | 12/2007 | Lubomirsky | C23C 16/452 |
| | | | | 118/723 R |
| 2008/0305018 | A1 | 12/2008 | Blum | |
| 2009/0205664 | A1 | 8/2009 | Lyon | |
| 2011/0060272 | A1 | 3/2011 | Iranitalab | |
| 2012/0258259 | A1 * | 10/2012 | Bansal | C23C 16/0272 |
| | | | | 118/723 R |
| 2012/0273340 | A1 | 11/2012 | Felix | |
| 2014/0030144 | A1 | 1/2014 | Krosney | |
| 2014/0231044 | A1 | 8/2014 | Duchesne | |
| 2015/0114397 | A1 | 4/2015 | Litz | |
| 2015/0214015 | A1 * | 7/2015 | Kikuchi | H01J 37/32651 |
| | | | | 423/325 |
| 2015/0283279 | A1 | 10/2015 | Lott | |
| 2015/0284845 | A1 * | 10/2015 | Toda | C23C 16/45512 |
| | | | | 118/725 |
| 2016/0017484 | A1 * | 1/2016 | Kikuchi | H01J 37/32357 |
| | | | | 427/569 |
| 2016/0215392 | A1 | 7/2016 | Yudovsky | |
| 2016/0284517 | A1 * | 9/2016 | Saido | C23C 16/452 |
| 2017/0028820 | A1 | 2/2017 | Walsh | |
| 2019/0145539 | A1 | 5/2019 | Dingman | |
| 2019/0348261 | A1 * | 11/2019 | Lin | C23C 16/45565 |
| 2020/0282086 | A1 | 9/2020 | Silverman | |
| 2020/0299836 | A1 * | 9/2020 | Nandwana | C23C 16/54 |
| 2021/0010130 | A1 * | 1/2021 | Narushima | C23C 16/4481 |
| 2021/0102290 | A1 * | 4/2021 | Acosta | C23C 16/45502 |
| 2021/0196851 | A1 | 7/2021 | Khan | |
| 2021/0393841 | A1 | 12/2021 | Vandyke | |
| 2022/0016299 | A1 | 1/2022 | Fischer | |
| 2022/0165547 | A1 * | 5/2022 | Pandey | C23C 16/45548 |
| 2022/0356578 | A1 * | 11/2022 | Cheng | C23C 16/52 |
| 2023/0061420 | A1 | 3/2023 | Higgins | |
| 2023/0173128 | A1 | 6/2023 | Slotkin | |

FOREIGN PATENT DOCUMENTS

| | | | |
|---|---|---|---|
| WO | 0176726 | A1 | 10/2001 |
| WO | 2017070359 | A1 | 4/2017 |
| WO | 2023091535 | A1 | 5/2023 |

* cited by examiner

METHODS AND APPARATUS FOR A VALVE ASSEMBLY

CROSS-REFERENCE TO RELATED APPLICATIONS

This application is a nonprovisional of, and claims priority to and the benefit of, U.S. Provisional Patent Application No. 63/523,972, filed Jun. 29, 2023 and entitled "METHODS AND APPARATUS FOR A VALVE ASSEMBLY," which is hereby incorporated by reference herein.

FIELD OF INVENTION

The present disclosure generally relates to a method and apparatus for a valve assembly. More particularly, the present disclosure relates to a valve assembly used in a semiconductor manufacturing tool.

BACKGROUND OF THE TECHNOLOGY

A valve assembly may be used to pulse chemistry and/or an inert gas into a reaction chamber. The valve assembly may also be configured to mix multiple chemistries prior to flowing the chemistry into the reaction chamber. Some thermal ALD (atomic layer deposition) reactions may be limited or difficult to achieve by only thermal means. Accordingly, it may be desired to activate molecules in the chemistry to enhance the reactivity of the chemistry prior to flowing the chemistry into the reaction chamber. It may also be desired to generate OH radicals to enhance active surface sites on the wafer.

SUMMARY OF THE INVENTION

Various embodiments of the present technology may provide a valve assembly that activates chemistry using UV light. The valve assembly includes a primary valve manifold connected to secondary valve manifolds. A transparent connector may be disposed between the primary valve manifold and the secondary valve manifold. A UV light may be disposed adjacent to the transparent connector.

According to one aspect, an apparatus comprises: a primary valve manifold, comprising: a main channel; a first sub-channel comprising a first end connected to the main channel at a connection point and a second end; and a second sub-channel comprising a third end connected to the main channel and the first sub-channel at the connection point and a fourth end; a first connector connected to the valve manifold and comprising a first gas channel, wherein the first connector is formed from a transparent material; a first ultraviolet (UV) light source adjacent to the first connector; and a first secondary manifold connected to the first connector and comprising a first plurality of inlets connected to a second gas channel.

In one embodiment of the above apparatus, the first gas channel is connected to the second end of the first sub-channel.

In one embodiment of the above apparatus, the first gas channel is connected to the second gas channel.

In one embodiment, the above apparatus further comprises a second connector connected to the primary valve manifold and comprising a third gas channel, wherein the second connector is formed from a transparent material.

In one embodiment, the above apparatus further comprises a second secondary manifold connected to the second connector and comprising a fourth gas channel connected and a second plurality of inlets connected to the fourth gas channel.

In one embodiment of the above apparatus, an inlet from the first plurality of inlets is configured to couple to a first source vessel containing a first chemistry and an inlet from the second plurality of inlets is configured to couple to a second source vessel containing a second chemistry, wherein the first chemistry is different from the second chemistry.

In one embodiment, the above apparatus further comprises a second UV light source adjacent to the second connector.

In one embodiment of the above apparatus, the second UV light source is positioned to radiate a UV light into the third gas channel.

In one embodiment of the above apparatus, the first UV light source is positioned to radiate a UV light into the first gas channel.

In one embodiment of the above apparatus, the transparent material is one of quartz or sapphire.

An apparatus, comprising: a primary valve manifold, comprising: a main channel; a first sub-channel comprising a first end connected to the main channel at a connection point and a second end; and a second sub-channel comprising a third end connected to the main channel and the first sub-channel at the connection point and a fourth end; a shield formed from a transparent material and disposed adjacent to the connection point; a light source adjacent to the transparent shield and positioned to radiate a light into the connection point; a first connector connected to the valve manifold and comprising a first plurality of inlets connected to the first sub-channel via a first gas channel; and a first secondary manifold connected to the primary valve manifold and comprising a second plurality of inlets connected to the second sub-channel via a second gas channel.

In one embodiment, the above apparatus further comprises a third gas channel connected to the main channel at the connection point and adjacent to the transparent shield.

In one embodiment of the above apparatus, the transparent material is one of quartz or sapphire.

In one embodiment of the above apparatus, the light source comprises an infrared light source.

In one embodiment of the above apparatus, the light source comprises an ultraviolet light source.

An apparatus, comprising, a valve manifold comprising a first gas channel, the first gas channel comprising: a main channel; a first sub-channel comprising a first end connected to the main channel at a connection point and a second end; and a second sub-channel comprising: a third end connected to the main channel and the first sub-channel at the connection point; and a fourth end; a first multi-port valve coupled to the second end of the first sub-channel; a first cell having an interior volume and sidewalls formed from a transparent material and, the first cell comprising: a first inlet; and a first outlet coupled to the first multi-port valve; and a first ultraviolet light source adjacent to the first cell.

In one embodiment of the above apparatus, the transparent material is one of quartz or sapphire.

In one embodiment, the above apparatus further comprises: a second multi-port valve coupled to the fourth end of the second sub-channel; and a second cell formed from the transparent material and comprising: a second inlet; and a second outlet coupled to the second multi-port valve; and a second ultraviolet light source adjacent to the second cell.

In one embodiment of the above apparatus, one port from the first multi-port valve is coupled to an inert gas source; and one port from the second multi-port valve is coupled to the inert gas source.

In one embodiment, the above apparatus further comprises: a first vessel coupled to the first cell, wherein the first vessel is configured to contain a first chemistry; and a second vessel coupled to the second cell, wherein the second cell is configured to contain a second chemistry that is different from the first chemistry.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

Figure 2:
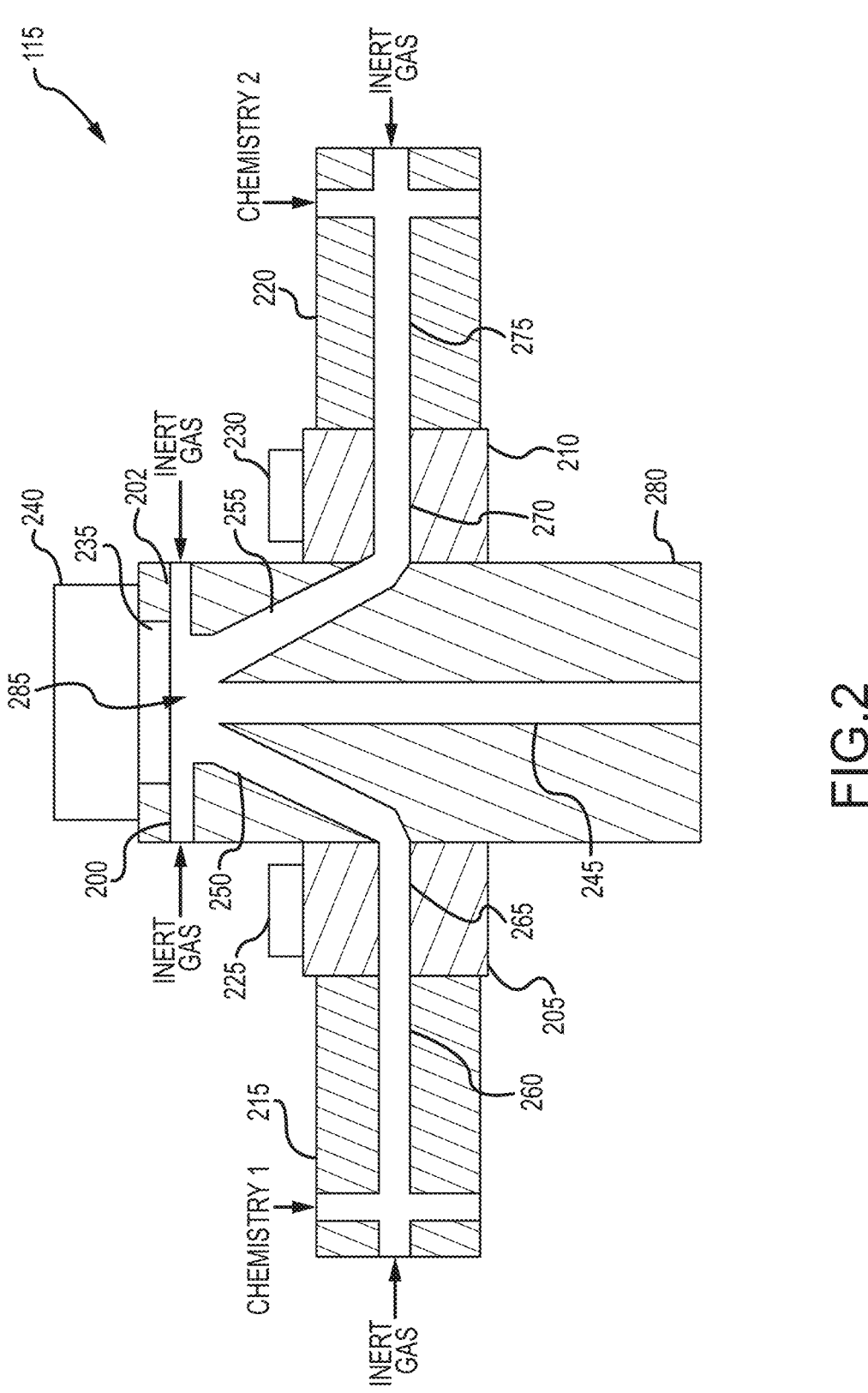
Figure 3:
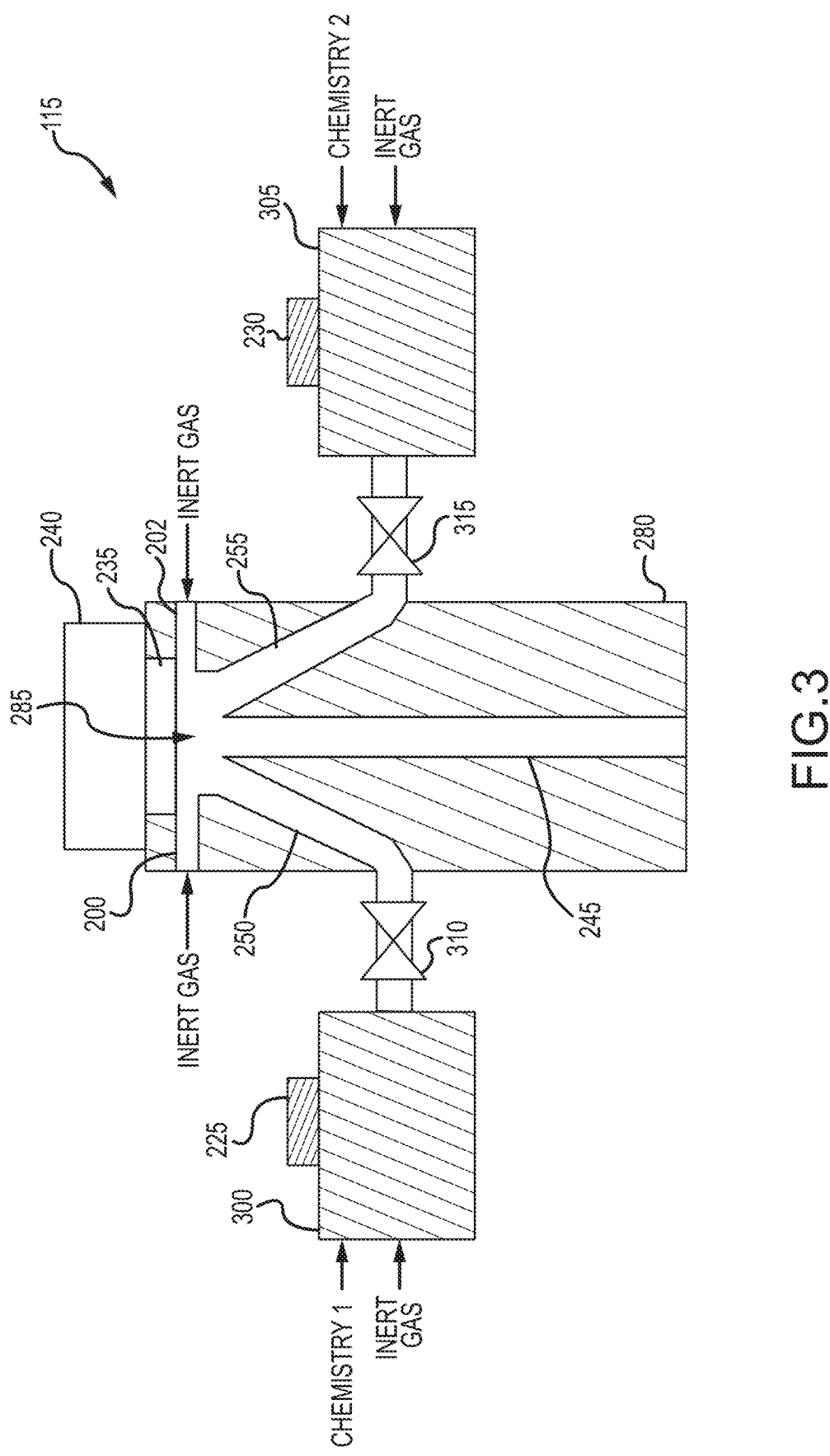
Figure 4:
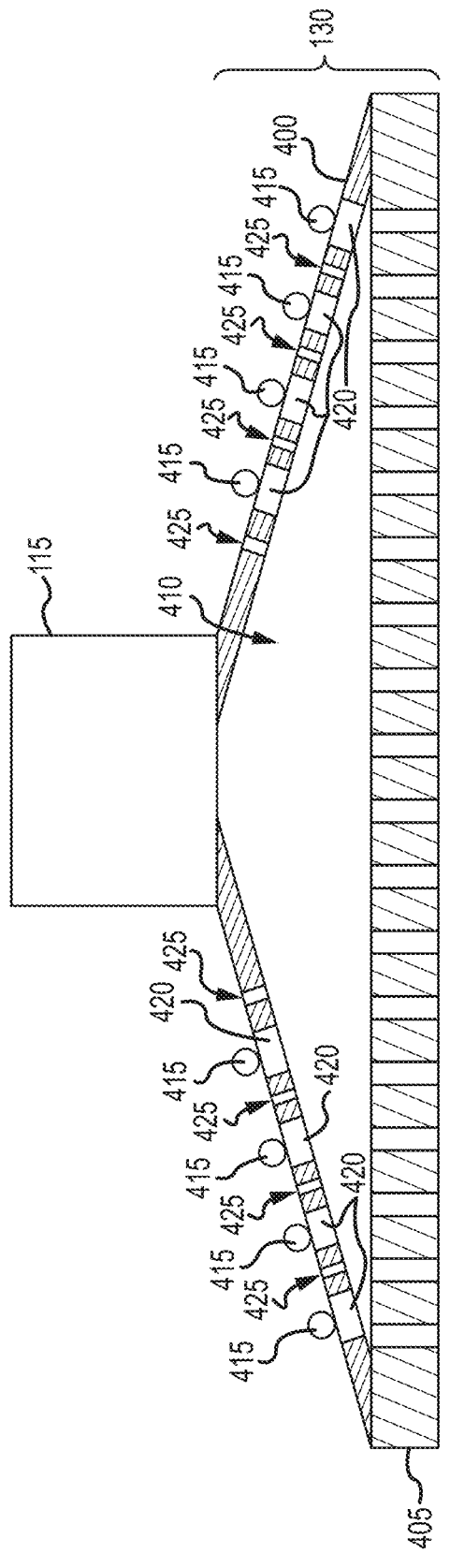

FIG. 1 is a system block diagram in accordance with various embodiments of the present technology;

FIG. 2 representatively illustrates a cross-sectional view of a valve assembly in accordance with various embodiments of the present technology;

FIG. 3 representatively illustrates a cross-sectional view of a valve assembly in accordance with alternative embodiments of the present technology; and FIG. 4 representatively illustrates a cross-sectional view of a showerhead assembly in accordance with embodiments of the present technology.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various reaction chambers, susceptors, valves, vessels, precursors, showerhead plate, and delivery lines.

Referring to FIG. 1, an exemplary system 100 may comprise a reactor 105 and a valve assembly 115. The reactor 105 may be configured to process a substrate (e.g., a wafer 125). For example, the reactor 105 may be configured to deposit a film on the wafer, perform etching, and the like. The reactor 105 may comprise a showerhead assembly 130 and a reaction chamber 110. The showerhead assembly 130 may be disposed above the reaction chamber 130 and above the wafer 125.

The system 100 may further comprise a first vessel 135 configured to contain or hold a first chemistry (e.g., a precursor or a reactant) used in a semiconductor manufacturing process. The first chemistry in the first vessel 135 may be in a solid, liquid, or gas phase initially. In the case of a solid or a liquid chemistry, the solid or liquid may be converted to a gas phase. For example, the first vessel 135 may comprise various devices and/or systems to convert a solid or a liquid to a gas. The conversion to a gas phase may occur within the first vessel 135.

The system 100 may further comprise a second vessel 155 configured to contain or hold a second chemistry (e.g., a precursor or a reactant) used in a semiconductor manufacturing process. The second chemistry may be different from the first chemistry. The second chemistry in the second vessel 155 may be in a solid, liquid, or gas phase initially.

In the case of a solid or a liquid chemistry, the solid or liquid may be converted to a gas phase. For example, the second vessel 155 may comprise various devices and/or systems to convert a solid or a liquid to a gas. The conversion to a gas phase may occur within the second vessel 155.

The system 100 may further comprise a third vessel 140 configured to contain or hold an inert gas.

In addition, the system 100 may further comprise a first gas line 145 to transport the gas from the first vessel 135 to the reactor 105 via the valve assembly 115. For example, the gas line 145 may be coupled to the first vessel 135 at a first end and to the valve assembly 115 at a second end.

In addition, the system 100 may further comprise a second gas line 150 to transport the gas from the second vessel 155 to the reactor 105 via the valve assembly 115. For example, the gas line 150 may be coupled to the second vessel 155 at a first end and to the valve assembly 115 at the second end.

In addition, the system 100 may further comprise a third gas line 160 to transport the gas from the third vessel 140 to the reactor 105 via the valve assembly 115. For example, the third gas line 160 may be coupled to the third vessel 140 at a first end and to the valve assembly 115 at the second end.

In various embodiments, the system 100 may further comprise a susceptor 120 disposed within the reaction chamber 110 and configured to support the wafer 125. In some embodiments, the susceptor 120 may be configured to move up and down within the reaction chamber 110. In other embodiments, the susceptor 120 may be stationary.

In various embodiments, the valve assembly 115 may be configured to mix multiple gas sources prior to flowing into the reactor 105. For example, the valve assembly 115 may have multiple inlets. The valve assembly 115 may be coupled directly to the reactor 105 and may be coupled to the first and second gas lines 145, 150 and configured to receive the gas from the first and second vessels 135, 140.

In various embodiments, and referring to FIG. 2, the valve assembly 115 may comprise a primary valve manifold 280 comprising a plurality of gas channels. For example, the valve assembly 115 may comprise a main channel 245, a first sub-channel 250, and a second sub-channel 255. In various embodiments, the main channel 245 and the first sub-channel 250 may be connected to each other at a connection point 285. In addition, the second sub-channel 255 may be connected to the main channel 245 at the connection point 285. Accordingly, the main channel 245, the first sub-channel 250, and the second sub-channel may be fluidly connected to each other via the connection point 285. The main channel 245 may be fluidly connected to the showerhead assembly 130. The primary valve manifold 280 may be formed from a metal material such as aluminum, stainless steel, nickel-based alloys, such as Hastelloy-C22, Inconel, and the like.

In an exemplary embodiment, the valve assembly 115 may further comprise a first connector 205 comprising a first gas channel 265 extending through the first connector 205. The first connector 205 may be formed from a transparent material, such as quartz, sapphire, or the like. Accordingly, the entire first connector 205 may be completely transparent, thus allowing visibility through the outer walls of the first connector 205 and into the third gas channel 270. The first connector 205 may be connected to the primary valve manifold 280, and the first gas channel 265 may be fluidly connected to the first sub-channel 250.

The valve assembly may further comprise a first secondary manifold 215 comprising a second gas channel 260 and a first plurality of inlets connected to the second gas channel 260. The first secondary manifold 215 may formed from a metal material, such as aluminum, stainless steel, nickel-based alloys, such as Hastelloy-C22, Inconel, and the like. In various embodiments, a first inlet from the first plurality of inlets may be configured to receive a first chemistry (chemistry 1), and a second inlet from the first plurality of inlets may be configured to receive an inert gas. The first secondary manifold 215 may be connected to the first connector 205, and the second gas channel 260 may be fluidly connected to the first gas channel 265.

The valve assembly 115 may further comprise a second connector 210 comprising a third gas channel 270 extending through the second connector 210. The second connector 210 may be formed from a transparent material, such as quartz, sapphire, or the like. Accordingly, the entire second connector 210 may be completely transparent, thus allowing visibility the outer walls of the second connector 210 and into the third gas channel 270. The second connector 210 may be connected to the primary valve manifold 280, and the third gas channel 270 may be fluidly connected to the second sub-channel 255.

The valve assembly 115 may further comprise a second secondary manifold 220 comprising a fourth gas channel 275 and a second plurality of inlets connected to the fourth gas channel 275. The second secondary manifold 220 may formed from a metal material, such as aluminum, stainless steel, nickel-based alloys, such as Hastelloy-C22, Inconel, and the like. In various embodiments, a first inlet from the second plurality of inlets may be configured to receive a second chemistry (chemistry 2), wherein the second chemistry is different from the first chemistry. A second inlet from the second plurality of inlets may be configured to receive the inert gas. The second secondary manifold 220 may be connected to the second connector 210, and the fourth gas channel 275 may be fluidly connected to the third gas channel 270.

In an exemplary embodiment, and referring to FIG. 3, the valve assembly 115 may comprise a first cell 300 and a second cell 305, each having an interior volume defined by sidewalls of the respective container, and configured to contain a gas. The first cell 300 may be connected to the primary valve manifold 280 via a first valve 310. For example, the first cell 300 may comprise an outlet connected to the first valve 310, and the first valve 310 may be connected to the first sub-channel 250. The first valve 310 may comprise a diaphragm valve or any other suitable valve. The first cell 300 may comprise a plurality of inlets, wherein one inlet is configured to receive the first chemistry and another inlet is configured to receive the inert gas. The first cell 300, in particular the sidewalls, may be formed from a transparent material, such as quartz, sapphire, or the like. Accordingly, the first cell 300 may be transparent, thus allowing visibility through sidewalls and into the interior volume.

Similarly, the second cell 305 may be connected to the primary valve manifold 280 via a second valve 315. For example, the second cell 305 may comprise an outlet connected to the second valve 315 and the second valve 315 may be connected to the second sub-channel 255. The second valve 315 may comprise a diaphragm valve or any other suitable valve. The second cell 305 may comprise a plurality of inlets, wherein one inlet is configured to receive the second chemistry and another inlet is configured to receive the inert gas. The second cell 305, in particular, the sidewalls, may be formed from a transparent material, such as quartz, sapphire, or the like. Accordingly, the second cell 305 may be transparent, thus allowing visibility through sidewalls and into the interior volume.

In various embodiments, the first and second valves 310, 315 may be responsive to and operated by a controller (not shown), processor, or other suitable control system. Accordingly, the controller may be configured to generate and transmit control signals to the valves 310, 315 to open or close the valve.

In various embodiments, and referring to FIGS. 2 and 3, the primary valve manifold 280 may further comprise a shield 235 disposed directly adjacent to the connection point 285. For example, the shield 235 may form a boundary for the connection point 285. In an exemplary embodiment, the shield 235 may be disposed at or within a top surface of the primary valve manifold 280. For example, the shield 235 may be embedded within the primary valve manifold 280. The shield 235 may be formed from a transparent material, such as quartz, sapphire, or the like.

In various embodiments, and referring to FIGS. 2 and 3, the primary valve manifold 280 may further comprise a fifth gas channel 200 and a sixth gas channel 202 configured to receive an inert gas, such as argon, nitrogen or other inert noble gas, and flow the inert gas into the primary valve manifold 280. The fifth and sixth gas channels 200, 202 may be fluidly connected to the connection point 285, and thus fluidly connected to the main channel 245. The fifth and sixth gas channels 200, 202 may be disposed directly adjacent to the shield 235, such that the inert gas flows across a bottom surface of the shield 235. The amount and pressure of the gas flowed through the fifth and sixth channels 200, 202 may be selected to create a gas curtain on the bottom surface of the shield 235 to prevent chemistry from depositing on the bottom surface of the shield 235. In an exemplary embodiment, at least a section of the fifth gas channel 200 is arranged horizontally and parallel to the bottom surface of the shield 235. For example, an inlet to the fifth gas channel 200 may be disposed at a top surface of the primary valve manifold 280 such that the fifth gas channel 200 is L-shaped, and an inlet to the sixth gas channel may be disposed at the top surface of the primary valve manifold 280 such that the sixth gas channel is L-shaped. In another embodiment, the fifth and sixth gas channels may extend radially outward from the connection point 285. Accordingly, an inlet to the fifth gas channel 200 may be disposed along a first sidewall of the primary valve manifold 280, and an inlet to the sixth gas channel 202 may be disposed along an opposing, second sidewall of the primary valve manifold 280. It will be understood that the primary valve manifold 280 may comprise additional gas channels on the same plane as the fifth and sixth gas channels and extending radially outward to the sidewalls.

In various embodiments, the valve assembly 115 may further comprise a light source, configured to radiate an ultraviolet (UV) light or an infrared (IR) light. Accordingly, the light source may comprise a UV light source or an IR light source. For example, the valve assembly 115 may comprise a first light source 225 and a second light source 230. In one embodiment, and referring to FIG. 2, the first light source 225 may be disposed adjacent to the first connector 205 and positioned to radiate light into the first gas channel 265. Similarly, the second light source 230 may be disposed adjacent to the second connector 210 and positioned to radiate light into the third gas channel 270.

In an alternative embodiment, and referring to FIG. 3, the first light source 225 may be disposed adjacent to the first cell 300 and positioned to radiate light into the first cell 300.

Similarly, the second light source 230 may be disposed adjacent to the second cell 305 and positioned to radiate light into the second cell 305.

In various embodiments, the valve assembly 115 may further comprise a third light source 240 disposed adjacent to the shield 235 and positioned to radiate light into the connection point 285.

In various embodiments, each light source 225, 230, 240 may be coupled to and controlled according to a controller (not shown), processor, or any other suitable control system. The controller may operate (e.g., turn ON and OFF) the light source. For example, in some operations, one light source may be ON, while the others are OFF. In addition, the controller may be configured to pulse a light source from OFF to ON and back to OFF according to a desired pulsing scheme.

In various embodiments, and referring to FIG. 4, the showerhead assembly 130 may comprise a lid 400 and a showerhead plate 405. The showerhead assembly 130 may further comprise a plenum space 410 defined by the lid 400 and the showerhead plate 405. The lid 400 may comprise a main inlet configured to allow gas from the valve assembly 115 to enter a plenum space 410.

The showerhead plate 405 may be positioned directly above the susceptor 120 or wafer 125 (FIG. 1) and may be configured to allow gas to pass through it and into the reaction chamber 110. For example, the showerhead plate 405 may comprise a plurality of through-holes extending from a first surface (e.g. a top surface) of the showerhead plate 405 to an opposing, second surface (e.g., a bottom surface) of the showerhead plate 405. Each through-hole may be configured to allow gas to flow from through the showerhead plate 405—i.e., from the top surface to the bottom surface.

In an exemplary embodiment, the lid 400 may be configured to provide UV and/or IR light into the plenum space 410. For example, the lid 400 may comprise a plurality of windows 420 embedded within the lid 400. The windows 420 may be formed from a transparent material, such as quartz, sapphire, or the like.

The showerhead assembly 130 may further comprise a plurality of light sources 415. The light sources 415 may be disposed along an outer surface of the lid 400 that is opposite from the plenum space 410. In some embodiments, the light sources 415 may be adhered to the outer surface of the lid 400. Alternatively, the light sources 415 may be near the outer face of the lid 400. In some embodiments, each light source 415 may be aligned with a respective window 420, such that the light from the light source 415 radiates through the window 420 and into the plenum space 410.

In some embodiments, the lid 400 may further comprise a plurality of channels 425 extending through the lid 400 and in fluid communication with the plenum space 410. The channels 425 may be connected to a gas source (such as the third vessel 140), wherein the gas source delivers an inert gas, such as argon, through the channels 425 and into the plenum space 410. In an exemplary embodiment, the gas channels 425 may be disposed adjacent to a respective window 420.

In operation, and referring to FIGS. 1 and 2, the first chemistry from the first vessel 135 may be flowed into the valve assembly 115 via the first secondary manifold 215 and the first connector 205. As the first chemistry flows through the first gas channel 265 of the first connector 205, the first light source 225 may be turned ON to radiate light into the first gas channel 265 and thus the flowing first chemistry. The light from the first light source 225 may activate the first chemistry. In particular, the light may trigger a chemical reaction, such as photodissociation, photolysis, photodecomposition, wherein the molecules of the chemical compound interact with photons to create highly reactive radicals/molecules and/or simpler molecules/fragments that are more reactive. Activating the molecules in the chemistry prior to flowing the chemistry into the reaction chamber 110 may enhance the reactivity of the chemistry and/or enhance the active surface sites on the wafer 125, thus providing improved film characteristics on the wafer 125.

Similarly, at the same time, or a different time as the first chemistry is flowed, the second chemistry from the second vessel 155 may be flowed into the valve assembly 115 via the second connector 210 and the second secondary manifold 220. As the second chemistry flows through the third gas channel 270 of the second connector 210, the second light source 230 may be turned ON to radiate light into the third gas channel 270 and thus, radiate the flowing second chemistry. The light from the second light source 230 may activate the second chemistry in the same manner as described above. The activated chemistry may then flow through the main channel 245 and into the showerhead assembly 130. Activating the molecules in the chemistry prior to flowing the chemistry into the reaction chamber 110 may enhance the reactivity of the chemistry and/or enhance the active surface sites on the wafer 125, thus providing improved film characteristics on the wafer 125.

Alternatively, the first and second chemistries may be flowed at the same time and thus mix together at the connection point 285. As both chemistries are flowed together, the third light source 240 may be turned ON to radiate light through the shield 235 and into the gas channels and connection point 285 and thus, radiate the flowing chemistries. In the present case, the first and second lights 225, 230 may be OFF while the first and second chemistries are flowing. The activated chemistry may then flow through the main channel 245 and into the showerhead assembly 130.

Alternatively, the first and second chemistries may be activated by multiple light sources. For example, as the first and second chemistries are flowed, the first and second lights 225, 230 may be ON to activate the respective chemistry as it flows through the first and second connectors 205, 210, respectively. In addition, the third light 240 may also be ON to activate the combination of the chemistries. The activated chemistry may then flow through the main channel 245 and into the showerhead assembly 130.

In yet another operation, and referring to FIG. 3, the first chemistry may be flowed into and contained within the first cell 300. Inert gas may also be flowed at the same or a different time as the first chemistry into the first cell 300. Once the first cell 300 is filled with the first chemistry (gas) to a desired pressure or amount, the first light source 225 may be turned ON. Alternatively, the first light source 225 may be ON while the first cell 300 is filling with chemistry. The light from the first light source 225 may activate the first chemistry. In particular, the light may trigger a chemical reaction, such as photodissociation, photolysis, photodecomposition, wherein the molecules of the chemical compound interact with photons to create highly reactive radicals/molecules and/or simpler molecules/fragments that are more reactive. Activating the molecules in the chemistry prior to flowing the chemistry into the reaction chamber 110 may enhance the reactivity of the chemistry and/or enhance the active surface sites on the wafer 125, thus providing improved film characteristics on the wafer 125. Once the chemistry is activated, the first valve 310 may be opened to allow the chemistry to flow into the primary valve manifold 280 via the first sub-channel 250. For example, the controller (not shown) may transmit a signal or otherwise operate the first valve 310 to open it. The chemistry may be further activated and/or combined with the second chemistry once it reaches the connection point 285. For example, the third light source 240 may be turned ON.

Similarly, the second chemistry may be flowed into and contained within the second cell 305. Inert gas may also be flowed at the same or a different time as the first chemistry into the second cell 305. Once the second cell 305 is filled with the second chemistry (gas) to a desired pressure or amount, the second light source 230 may be turned ON. Alternatively, the second light source 230 may be ON while the second cell 305 is filling with chemistry. The light from the second light source 230 may activate the second chemistry. In particular, the light may trigger a chemical reaction, such as photodissociation, photolysis, photodecomposition, wherein the molecules of the chemical compound interact with photons to create highly reactive radicals/molecules and/or simpler molecules/fragments that are more reactive. Activating the molecules in the chemistry prior to flowing the chemistry into the reaction chamber 110 may enhance the reactivity of the chemistry and/or enhance the active surface sites on the wafer 125, thus providing improved film characteristics on the wafer 125. Once the chemistry is activated, the second valve 315 may be opened to allow the chemistry to flow into the primary valve manifold 280 via the first sub-channel 250. For example, the controller (not shown) may transmit a signal or otherwise operate the second valve 315 to open it. The chemistry may be further activated and/or combined with the first chemistry once it reaches the connection point 285. For example, the third light source 240 may be turned ON.

In yet another operation, and referring to FIG. 4, as chemistry is flowed from the valve assembly 115 into the plenum space 410, the light sources 415 may be turned ON. Light from the light source 415 may pass through the respective window 420 and into the plenum space 410 and activate the chemistry in the plenum space. Activating the molecules in the chemistry may enhance the reactivity of the chemistry and/or enhance the active surface sites on the wafer 125, thus providing improved film characteristics on the wafer 125. At the same time, gas may be flowed through the channels 425. The amount and pressure of the gas flowed through the channels 425 may be selected to create a gas curtain on the windows 420 to prevent chemistry from depositing on the windows 420.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

What is claimed is:

1. An apparatus, comprising:
  a primary valve manifold, comprising:
    a main channel;
    a first sub-channel comprising a first end connected to the main channel at a connection point and a second end; and
    a second sub-channel comprising a third end connected to the main channel and the first sub-channel at the connection point and a fourth end;
  a first connector connected to the valve manifold and comprising a first gas channel, wherein the first connector is formed from a transparent material;
  a first ultraviolet (UV) light source adjacent to the first connector; and
  a first secondary manifold connected to the first connector and comprising a first plurality of inlets connected to a second gas channel.

2. The apparatus according to claim 1, wherein the first gas channel is connected to the second end of the first sub-channel.

3. The apparatus according to claim 2, wherein the first gas channel is connected to the second gas channel.

4. The apparatus according to claim 1, further comprising a second connector connected to the primary valve manifold and comprising a third gas channel, wherein the second connector is formed from a transparent material.

5. The apparatus according to claim 4, further comprising a second secondary manifold connected to the second connector and comprising a fourth gas channel and a second plurality of inlets connected to the fourth gas channel.

6. The apparatus according to claim 5, wherein an inlet from the first plurality of inlets is configured to couple to a first source vessel containing a first chemistry and an inlet from the second plurality of inlets is configured to couple to a second source vessel containing a second chemistry, wherein the first chemistry is different from the second chemistry.

7. The apparatus according to claim 4, further comprising a second UV light source adjacent to the second connector.

8. The apparatus according to claim 7, wherein the second UV light source is positioned to radiate a UV light into the third gas channel.

9. The apparatus according to claim 1, wherein the first UV light source is positioned to radiate a UV light into the first gas channel.

10. The apparatus according to claim 1, wherein the transparent material is one of quartz or sapphire.

11. An apparatus, comprising:
   a primary valve manifold, comprising:
      a main channel;
      a first sub-channel comprising a first end connected to the main channel at a connection point and a second end; and
      a second sub-channel comprising a third end connected to the main channel and the first sub-channel at the connection point and a fourth end;
   a shield formed from a transparent material and disposed adjacent to the connection point;
   a light source adjacent to the transparent shield and positioned to radiate a light into the connection point;
   a first connector connected to the valve manifold and comprising a first plurality of inlets connected to the first sub-channel via a first gas channel; and
   a first secondary manifold connected to the primary valve manifold and comprising a second plurality of inlets connected to the second sub-channel via a second gas channel.

12. The apparatus according to claim 11, further comprising a third gas channel connected to the main channel at the connection point and adjacent to the transparent shield.

13. The apparatus according to claim 11, wherein the transparent material is one of quartz or sapphire.

14. The apparatus according to claim 11, wherein the light source comprises an infrared light source.

15. The apparatus according to claim 11, wherein the light source comprises an ultraviolet light source.

16. An apparatus, comprising,
   a valve manifold comprising a first gas channel, the first gas channel comprising:
      a main channel;
      a first sub-channel comprising a first end connected to the main channel at a connection point and a second end; and
      a second sub-channel comprising:
         a third end connected to the main channel and the first sub-channel at the connection point; and
         a fourth end;
   a first multi-port valve coupled to the second end of the first sub-channel;
   a first cell having an interior volume and sidewalls formed from a transparent material and, the first cell comprising:
      a first inlet; and
      a first outlet coupled to the first multi-port valve; and
   a first ultraviolet light source adjacent to the first cell.

17. The apparatus according to claim 16, wherein the transparent material is one of quartz or sapphire.

18. The apparatus according to claim 16, further comprising:
   a second multi-port valve coupled to the fourth end of the second sub-channel; and
   a second cell formed from the transparent material and comprising:
      a second inlet; and
      a second outlet coupled to the second multi-port valve; and
   a second ultraviolet light source adjacent to the second cell.

19. The apparatus according to claim 18, wherein one port from the first multi-port valve is coupled to an inert gas source; and one port from the second multi-port valve is coupled to the inert gas source.

20. The apparatus according to claim 16, further comprising:
   a first vessel coupled to the first cell, wherein the first vessel is configured to contain a first chemistry; and
   a second vessel coupled to the second cell, wherein the second cell is configured to contain a second chemistry that is different from the first chemistry.

* * * * *